United States Patent
Watanabe et al.

(10) Patent No.: US 10,718,572 B2
(45) Date of Patent: Jul. 21, 2020

(54) HEAT SINK

(71) Applicant: FURUKAWA ELECTRIC CO., LTD., Tokyo (JP)

(72) Inventors: Yosuke Watanabe, Tokyo (JP); Tatsuro Miura, Tokyo (JP); Toshiaki Nakamura, Tokyo (JP); Kenya Kawabata, Tokyo (JP); Yoshikatsu Inagaki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/779,146

(22) Filed: Jan. 31, 2020

(65) Prior Publication Data
US 2020/0173730 A1 Jun. 4, 2020

Related U.S. Application Data

(63) Continuation of application No. PCT/JP2019/045900, filed on Nov. 25, 2019.

(30) Foreign Application Priority Data

Nov. 30, 2018 (JP) .................. 2018-226034

(51) Int. Cl.
*F28D 15/00* (2006.01)
*F28D 15/04* (2006.01)
(Continued)

(52) U.S. Cl.
CPC ......... *F28D 15/04* (2013.01); *F28D 15/0233* (2013.01); *F28D 15/0275* (2013.01);
(Continued)

(58) Field of Classification Search
CPC ......... F28D 15/0275; F28D 2021/0029; F28D 15/04; F28D 15/0233; F28F 2215/00; F28F 9/22
(Continued)

(56) References Cited

U.S. PATENT DOCUMENTS 6,695,040 B1    2/2004 Kung et al.
10,126,069 B2 * 11/2018 Sun .................. F28D 15/04
(Continued)

FOREIGN PATENT DOCUMENTS

JP    55-102889 A    8/1980
JP    4-198690 A    7/1992
(Continued)

OTHER PUBLICATIONS

International Search Report for PCT/JP2019/045900 (PCT/ISA/210) dated Dec. 24, 2019.
(Continued)

*Primary Examiner* — Claire E Rojohn, III
(74) *Attorney, Agent, or Firm* — Birch, Stewart, Kolasch & Birch, LLP

(57) ABSTRACT

The present disclosure is to provide a heat sink capable of improving cooling efficiency of a heat radiation fin and exhibiting excellent cooling performance with respect to a cooling target regardless of an installation posture of the heat sink, and capable of being installed even in a narrow space. The heat sink includes: a heat transport member having a heat receiving portion thermally connected to a heat-generating element and including a first wick structure; a tube body connected to a heat insulating portion or a heat radiating portion of the heat transport member and including a second wick structure; and a heat radiation fin group which is thermally connected to the tube body and in which a plurality of heat radiation fins are arranged, in which, the
(Continued)

heat transport member has an integral internal space that communicates from the heat receiving portion to a connection portion with the tube body and is sealed with a working fluid, the internal space of the heat transport member communicating with an internal space of the tube body, and the first wick structure includes a branch portion branched in a thickness direction of the heat transport member and multi-stage stem parts extending from the branch portion in a predetermined direction.

11 Claims, 4 Drawing Sheets

(51) Int. Cl.
| | | |
|---|---|---|
| *F28D 15/02* | (2006.01) | |
| *F28F 9/22* | (2006.01) | |
| *H05K 7/20* | (2006.01) | |
| *F28D 21/00* | (2006.01) | |

(52) U.S. Cl.
CPC ........ *F28F 9/22* (2013.01); *F28D 2021/0029* (2013.01); *F28F 2215/00* (2013.01); *H05K 7/20336* (2013.01)

(58) Field of Classification Search
USPC .................................................. 165/104.26
See application file for complete search history.

(56) References Cited

U.S. PATENT DOCUMENTS

| | | | | |
|---|---|---|---|---|
| 10,330,392 | B2* | 6/2019 | Liu | F28D 15/046 |
| 10,371,458 | B2* | 8/2019 | Sun | F28D 15/046 |
| 2002/0189793 | A1* | 12/2002 | Noda | F28D 15/0233 |
| | | | | 165/104.26 |
| 2003/0178181 | A1* | 9/2003 | Noda | F28F 3/02 |
| | | | | 165/80.3 |
| 2003/0205363 | A1 | 11/2003 | Chu et al. | |
| 2005/0173098 | A1* | 8/2005 | Connors | F28D 15/02 |
| | | | | 165/104.33 |
| 2006/0151153 | A1* | 7/2006 | Chen | F28D 15/02 |
| | | | | 165/104.26 |
| 2007/0044451 | A1 | 3/2007 | Jones | |
| 2007/0272399 | A1* | 11/2007 | Nitta | F28D 15/0233 |
| | | | | 165/185 |
| 2008/0144319 | A1* | 6/2008 | Chang | B82Y 10/00 |
| | | | | 362/294 |
| 2011/0000649 | A1* | 1/2011 | Joshi | H01L 23/427 |
| | | | | 165/104.26 |
| 2015/0043168 | A1 | 2/2015 | Douglas et al. | |
| 2016/0245593 | A1* | 8/2016 | Rice | F28D 15/046 |
| 2017/0176112 | A1* | 6/2017 | Sarraf | F28D 15/02 |
| 2017/0330819 | A1* | 11/2017 | Tao | F25B 39/00 |
| 2017/0356694 | A1* | 12/2017 | Tan | F28D 15/0266 |
| 2017/0363367 | A1* | 12/2017 | Yeh | F28D 15/0258 |
| 2019/0214695 | A1* | 7/2019 | Miura | H01M 10/6556 |
| 2019/0271510 | A1* | 9/2019 | Yang | F28F 21/081 |
| 2019/0271511 | A1* | 9/2019 | Kishimoto | F28D 15/04 |
| 2019/0316848 | A1* | 10/2019 | Tseng | F28D 15/025 |
| 2019/0323780 | A1 | 10/2019 | Ahamed et al. | |
| 2020/0049417 | A1* | 2/2020 | Machida | H01L 23/427 |
| 2020/0049418 | A1* | 2/2020 | Chu | F28D 15/0233 |

FOREIGN PATENT DOCUMENTS

| | | |
|---|---|---|
| JP | 7-161888 A | 6/1995 |
| JP | 8-61873 A | 3/1996 |
| JP | 2003-110072 A | 4/2003 |
| JP | 2003-336976 A | 11/2003 |
| JP | 2005-9728 A | 1/2005 |
| JP | 2007-3034 A | 1/2007 |
| JP | 2007-317876 A | 12/2007 |
| JP | 2012-132582 A | 7/2012 |
| JP | 2016-223673 A | 12/2016 |
| WO | WO 2018/097131 A1 | 5/2018 |

OTHER PUBLICATIONS

Notice of Allowance for the corresponding Japanese application No. 2018-226034 dated Jul. 1, 2019.
Notification of Reasons for refusal for the corresponding Japanese application No. 2018-226034 dated May 8, 2019.
Written Opinion of the International Searching Authority for PCT/JP2019/045900 (PCT/ISA/237) dated Dec. 24, 2019.
Office Action dated Jun. 2, 2020 in corresponding Chinese Patent Application No. 201911214614.9.

* cited by examiner

HEAT SINK

CROSS REFERENCE TO RELATED APPLICATIONS

The present application is a continuation application of International Patent Application No. PCT/JP2019/045900 filed on Nov. 25, 2019, which claims the benefit of Japanese Patent Application No. 2018-226034, filed on Nov. 30, 2018. The contents of these applications are incorporated herein by reference in their entirety.

BACKGROUND

Technical Field

The present disclosure relates to a heat sink that cools electrical and electronic components and the like, and more particularly, to a heat sink that can reliably cool the electrical and electronic components and the like even when a heat generation amount increases.

Background

With advanced functions of electronic devices, a large number of components including heat-generating elements, such as electronic components, are mounted inside the electronic device with a high density. In addition, with advanced functions of the electronic devices, the amount of heat generated by heat-generating elements such as electronic components increase. A heat sink may be used as means for cooling the heat-generating element, such as an electronic component. Generally, a heat sink (heat pipe type heat sink) having a tube-shaped heat pipe is used as the heat sink.

As a heat pipe type heat sink, there is, for example, a heat pipe type heat sink in which multiple plate-shaped heat radiation fins are provided so as to protrude to an outer peripheral surface of a plurality of tube-shaped heat pipes (Japanese Patent Application Publication No. 2003-110072). The heat pipe type heat sink of Japanese Patent Application Publication No. 2003-110072 is a heat sink formed such that the heat of a heat-generating element is transported to the heat radiation fins by a plurality of tube-shaped heat pipes and radiated from the heat radiation fins.

Meanwhile, in recent years, since a large number of components including heat-generating elements, such as electronic components, are mounted inside the electronic devices with increasingly high density, it is required to further reduce a space of the heat sink. Moreover, since a heat generation amount from the electronic components and the like is increasing, it is also required to further improve cooling characteristics of the heat sink.

In order to improve the cooling characteristics in a heat sink, such as the heat sink of Japanese Patent Application Publication No. 2003-110072 that transports the heat of the heat-generating element to the heat radiation fins from a heat receiving portion by the plurality of heat pipes, it is necessary to form a heat pipe group in which multiple heat pipes are arranged in parallel, and to thermally connect the heat pipe group to the heat-generating element. However, in order to thermally connect the heat pipe group formed with the multiple heat pipes to the heat-generating element, it is necessary to secure a large space for installing the heat sink inside the electronic device. That is, the heat pipe type heat sink has room for improvement in further space saving of the heat sink. In the heat pipe type heat sink, further, there is a case where circulating characteristics of a liquid-phase working fluid in the heat pipe is not sufficient.

In addition, since a rounded portion is provided on an outer peripheral surface of each heat pipe and a void generated outside the Rounded portion does not contribute to the heat transport of the heat pipe group, a volume of an evaporation portion and a volume of a condensation portion of the heat pipe group cannot be sufficiently obtained, and sufficient cooling characteristics cannot also be exhibited in some cases.

In addition, since a large number of components are mounted in the electronic device with a higher density, the heat sink may be installed in a posture in which the heat receiving portion of the heat sink is located above the heat radiating portion in a gravity direction. In the heat pipe type heat sink, when the heat receiving portion of the heat sink is installed above the heat radiating portion in the gravity direction, the circulating characteristics of the liquid-phase working fluid in the heat pipe are not sufficient, the volume of the evaporation portion and the volume of the condensation portion of the heat pipe group cannot be sufficiently obtained, and thus heat transport characteristics of the heat pipe group may be deteriorated. Therefore, when the heat pipe is installed horizontally, and the heat pipe is connected above the heat radiation fin in the gravity direction in order to prevent the deterioration of the heat transport characteristics of the heat pipe group while saving the space of the heat sink, cooling efficiency of the heat radiation fin is reduced, and thus there is room for improvement in cooling characteristics of the heat sink.

SUMMARY

In view of the above-described circumstances, an object of the present disclosure is to provide a heat sink that, regardless of an installation posture of the heat sink, can improve cooling efficiency of a heat radiation fin and exhibit excellent cooling performance with respect to a cooling target, and can be installed even in a narrow space.

The present disclosure includes the following configurations:

[1] A heat sink includes: a heat transport member having a heat receiving portion thermally connected to a heat-generating element and including a first wick structure; a tube body connected to a heat insulating portion or a heat radiating portion of the heat transport member and including a second wick structure; and a heat radiation fin group which is thermally connected to the tube body and in which a plurality of heat radiation fins are arranged, wherein the heat transport member has an integral internal space that communicates from the heat receiving portion to a connection portion with the tube body and is sealed with a working fluid, the internal space of the heat transport member communicating with an internal space of the tube body, and the first wick structure includes a branch portion branched in a thickness direction of the heat transport member and multi-stage stem parts extending from the branch portion in a predetermined direction.

[2] In the heat sink according to [1], a plurality of tube bodies are arranged in the thickness direction of the heat transport member.

[3] In the heat sink according to [1] or [2], the stem part has a part extending in a heat transport direction of the heat transport member.

[4] In the heat sink according to any one of [1] to [3], the stem part is connected to the second wick structure via a connection member.

[5] In the heat sink according to [4], the connection member is a wick member having a capillary force.

[6] In the heat sink according to [4] or [5], wherein the connection member is supported by a support member.

[7] In the heat sink according to any one of [1] to [6], a heat-receiving-portion surface area increasing portion is provided on an inner surface of the heat receiving portion.

[8] In the heat sink according to any one of [1] to [7], the tube body extends along an arrangement direction of the heat radiation fins.

[9] In the heat sink according to any one of [1] to [8], an extending direction of the tube body is not parallel to a heat transport direction of the heat transport member.

[10] In the heat sink according to any one of [1] to [9], the tube body extends in a plurality of direction from the heat transport member.

[11] In the heat sink according to any one of [1] to [10], at least one surface of the heat transport member has a planar shape.

In the aspect of the above-described [1], the part of the heat transport member thermally connected to the heat-generating element, which is the cooling target, functions as the heat receiving portion, and the part thereof connected to the tube body functions as the heat insulating portion or the heat radiating portion of the heat transport member. Therefore, in the aspect of the heat sink of the present disclosure, the heat transport member transports the heat of the heat-generating element from the heat receiving portion to the tube body. In addition, the working fluid, which has changed in phase into the gas phase when the heat transport member receives the heat from the heat-generating element, flows from the heat transport member to the tube body. When the gas-phase working fluid flows from the heat transport member to the tube body, the tube body receives the heat from the heat transport member and further transports the heat, which is received from the heat transport member, to the heat radiation fin group. The heat transported from the tube body to the heat radiation fin group is released from the heat radiation fin group to the external environment of the heat sink. Furthermore, in the aspect of the above-described [1], since the first wick structure accommodated in the heat transport portion includes the branch portion branched in the thickness direction of the heat transport member, a plurality of stem parts extending in a predetermined direction from the branch portion are formed to a multi-stage structure. The thickness direction of the heat transport member in the aspect of the above-described [1] is orthogonal to the heat transport direction of the heat transport member.

In the aspect of the heat sink according to the present disclosure, the internal space of the heat transport member having the heat receiving portion is different from the internal space of the heat pipe group in which the plurality of heat pipes are arranged in parallel, and the entire internal space is integrated in a communicating manner. Accordingly, according to the aspect of the heat sink of the present disclosure in which the heat transport member having the integral internal space transports the heat of the heat-generating element from the heat receiving portion to the connection portion with the tube body thermally connected to the heat radiation fin, the circulating characteristics of the liquid-phase working fluid is excellent, and even when the heat generation amount from the heat-generating element increases, that is, even when the heat receiving amount in the heat receiving portion increases, it is possible to equalize the heat input in the heat receiving portion and increase the volume of the heat receiving portion, and to reduce heat resistance in the heat receiving portion. Therefore, even when the heat sink is installed in a posture in which the heat receiving portion of the heat sink is located above the heat radiating portion in the gravity direction, excellent cooling performance can be exhibited on the cooling target. In addition, since the entire internal space of the heat transport member is integrated in a communicating manner, the entire heat-generating element can be uniformly cooled even when heating unevenness occurs in the heat-generating element. Since the first wick structure has a multi-stage structure, the gas-phase working fluid can smoothly flow from the heat transport member to the tube body. Further, according to the aspect of the heat sink of the present disclosure, since the plurality of tube bodies are arranged in the thickness direction of the heat transport member and the first wick structure accommodated in the heat transport member includes the branch portion branched in the thickness direction of the heat transport member and the multi-stage stem part extending from the branch portion, the heat radiation fin thermally connected to the tube body can be improved in cooling efficiency, and to exhibit excellent cooling performance with respect to the cooling target.

Further, according to the aspect of the heat sink of the present disclosure, since the entire internal space of the heat transport member including the heat receiving portion is integrated in a communicating manner, the dimension of the heat transport member in the width direction (dimension in the direction orthogonal to the heat transport direction of the heat transport member) can be reduced without deterioration of cooling performance, and, as a result, the heat sink can be installed even in a narrow space and can also be installed on the cooling target mounted with a high density.

According to the aspect of the heat sink of the present disclosure, since the branched stem part of the first wick structure accommodated in the heat transport member is connected to the second wick structure provided on the tube body through the connection member, even when the plurality of tube bodies are arranged in the thickness direction of the heat transport member or even when one tube body is arranged, the working fluid, which has changed in phase into the liquid phase inside the tube body, can smoothly circulate from the tube body to the heat transport member. Therefore, since the flow characteristics of the working fluid are improved, the heat sink is improved in cooling performance.

According to the aspect of the heat sink of the present disclosure, since the connection member is supported by the support member, it is possible to prevent inhibition of the flow of the liquid-phase working fluid, which circulates through the connection member, by the flow of the gas-phase working fluid.

According to the aspect of the heat sink of the present disclosure, since the tube body that communicates with the internal space of the heat transport member extends along the arrangement direction of the heat radiation fins, the gas-phase working fluid flows inside the tube body along the arrangement direction of the heat radiation fins. Therefore, the cooling efficiency of the heat radiation fin group is improved, and the heat sink can exhibit more excellent cooling performance.

According to the aspect of the heat sink of the present disclosure, since the extending direction of the tube body is not parallel to the heat transport direction of the heat transport member, the heat transported from the heat transport member is transported in a direction different from the extending direction of the heat transport member. Therefore, it is possible to prevent an increase in dimension of the heat sink in the heat transport direction of the heat transport member, and to achieve space saving in the heat transport direction of the heat transport member.

According to the aspect of the heat sink of the present disclosure, since the tube body extends from the heat transport member in a plurality of directions, the heat transported from the heat transport member is transported in a plurality of directions different from the heat transport direction of the heat transport member. Therefore, it is possible to achieve space saving of the heat sink in the heat transport direction of the heat transport member.

DETAILED DESCRIPTION

Figure 1:
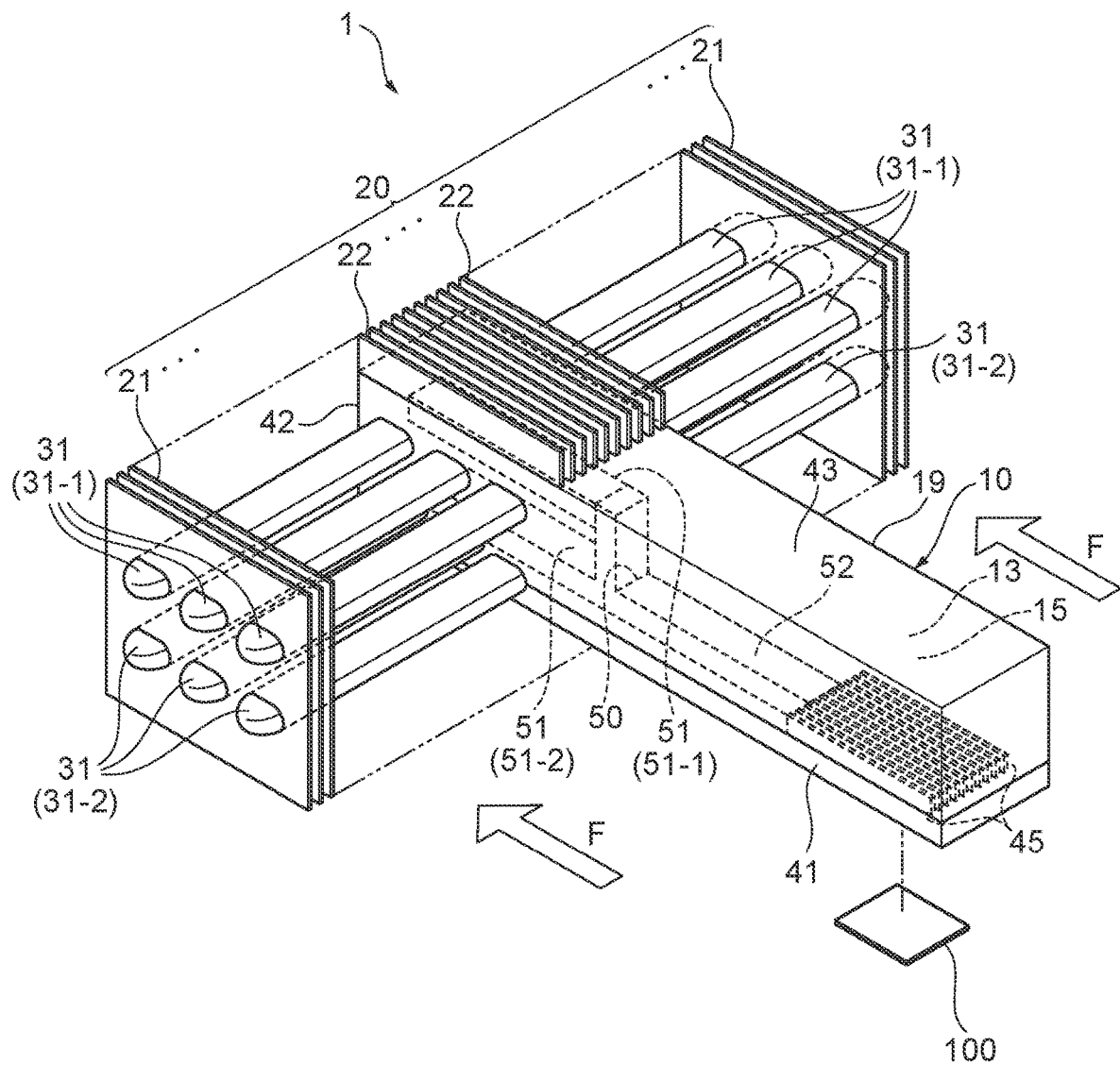
FIG. 1 is an external perspective view schematically illustrating a heat sink according to an embodiment of the present disclosure.
Figure 2:
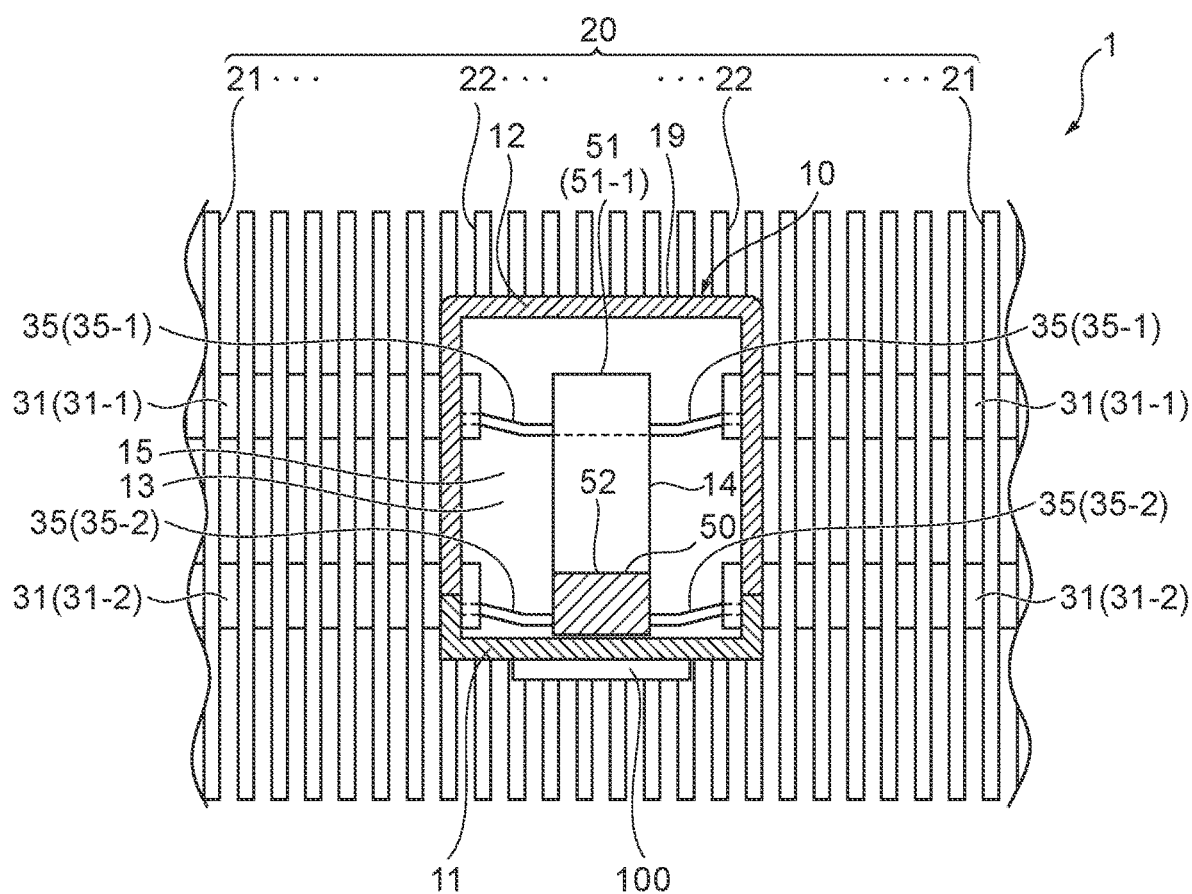
FIG. 2 is a front sectional view schematically illustrating an inside of the heat sink according to the embodiment of the present disclosure.
Figure 3:
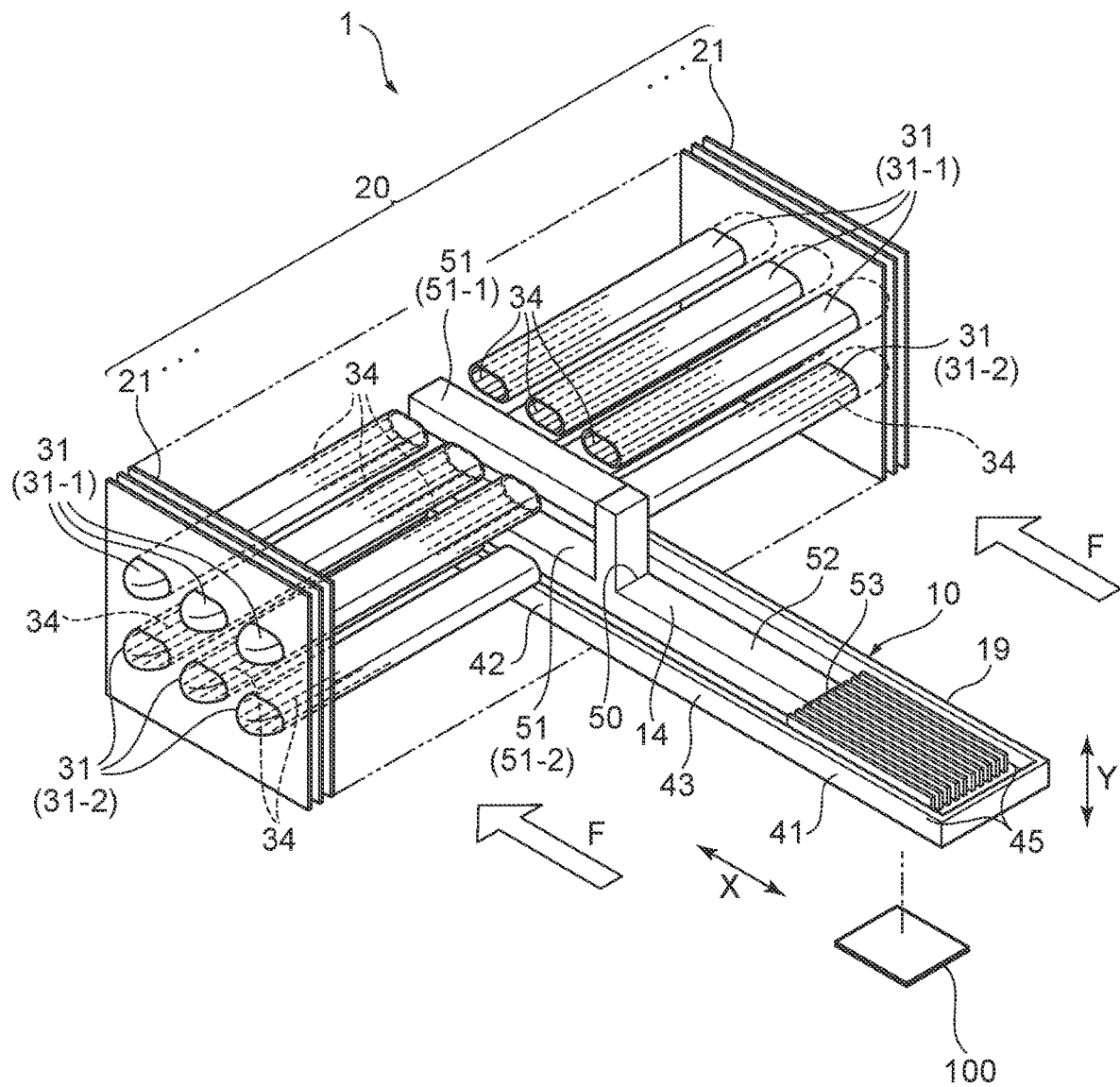
FIG. 3 is a perspective view schematically illustrating the inside of the heat sink according to the embodiment of the present disclosure.
Figure 4:
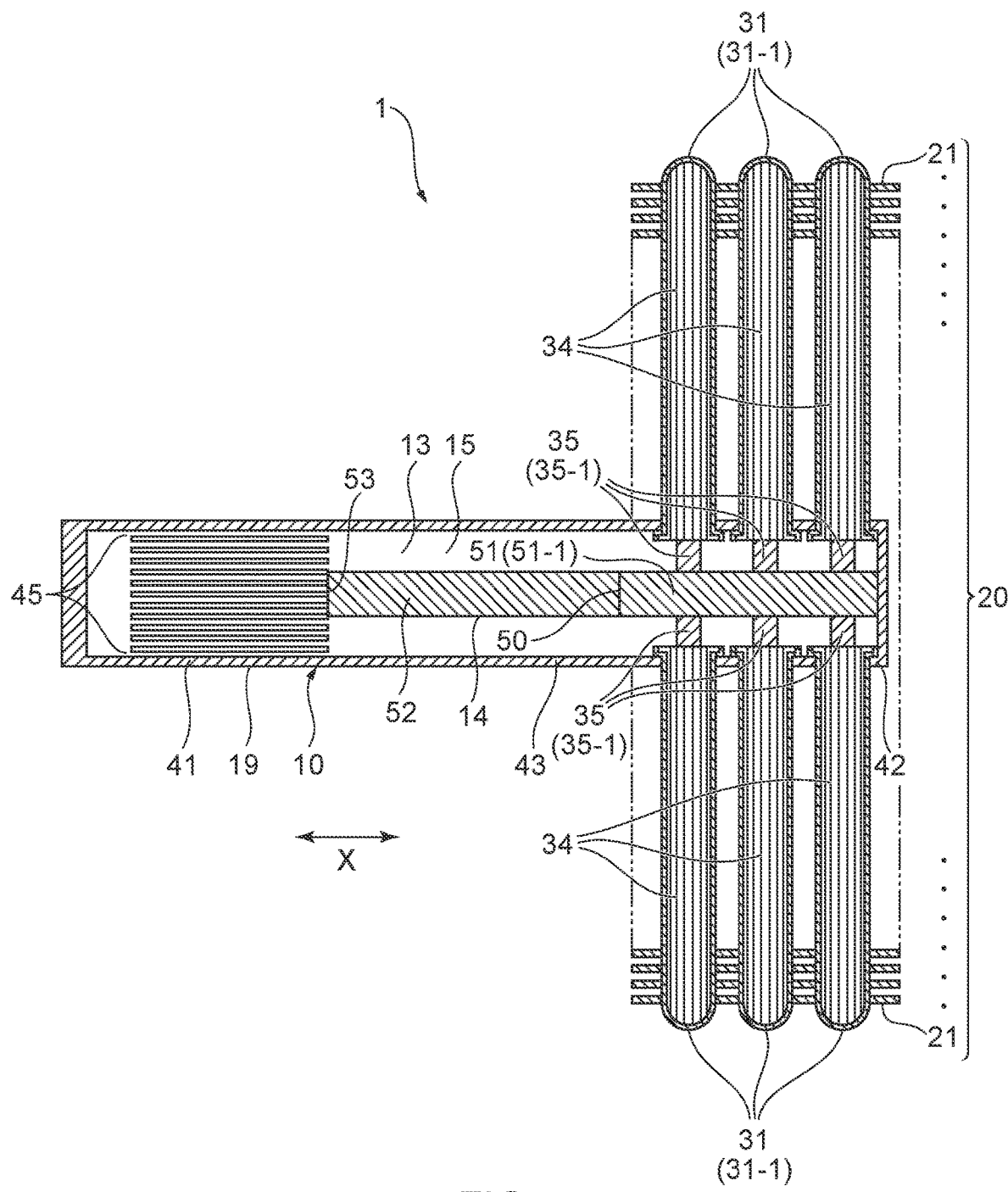
FIG. 4 is a plane sectional view schematically illustrating the inside of the heat sink according to the embodiment of the present disclosure.

Hereinafter, a heat sink according to embodiments of the present disclosure will be described with reference to the drawings. FIG. 1 is an external perspective view schematically illustrating a heat sink according to an embodiment of the present disclosure. FIG. 2 is a front sectional view schematically illustrating an inside of the heat sink according to the embodiment of the present disclosure. FIG. 3 is a perspective view schematically illustrating the inside of the heat sink according to the embodiment of the present disclosure. FIG. 4 is a plane sectional view schematically illustrating the inside of the heat sink according to the embodiment of the present disclosure.

As illustrated in FIG. 1, a heat sink 1 according to an embodiment of the present disclosure includes: a heat transport member 10 having a heat receiving portion 41 thermally connected to a heat-generating element 100; a tube body 31 thermally connected to a heat radiating portion 42 of the heat transport member 10; and a heat radiation fin group 20 which is thermally connected to the heat transport member 10 and the tube body 31 and arranged with a plurality of heat radiation fins 21 and 22. Further, the internal space of the heat transport member 10 communicates with the internal space of the tube body 31. In other words, in the heat sink 1, the heat transport member 10 has an integral internal space that communicates from the heat receiving portion 41 to a connection portion with the tube body 31 and is sealed with a working fluid.

As illustrated in FIG. 2, the heat transport member 10 includes a container 19 having a hollow cavity portion 13 and a working fluid (not illustrated) that flows through the cavity portion 13. A first wick structure 14 having a capillary force is accommodated in the cavity portion 13. The container 19 is formed by stacking one plate-shaped body 11 and another plate-shaped body 12 that faces the one plate-shaped body 11.

Both of one plate-shaped body 11 and the other plate-shaped body 12 have a protruding part. The protruding parts of one plate-shaped body 11 and the other plate-shaped body 12 form the cavity portion 13 of the container 19. The cavity portion 13 of the container 19 forms an integral internal space. In addition, the shape of the container 19 is a planar type. The shape of the container 19 in plan view (the shape viewed from a vertical direction with respect to a plane portion of the heat transport member 10) is not particularly limited, but, in the heat transport member 10, is a shape having substantially the same width along a heat transport direction X in plan view, that is, a substantially rectangular shape in plan view. The cavity portion 13 is an internal space sealed with respect to external environments, and is decompressed by deaeration processing.

As illustrated in FIG. 1, a part of an outer surface of the container 19 to which the heat-generating element 100 which is a cooling target is thermally connected is the heat receiving portion 41 of the heat transport member 10, the heat-generating element 100 is thermally connected to the container 19, and accordingly, the heat-generating element 100 is cooled by the heat sink 1. In the heat transport member 10, since the heat-generating element 100 is thermally connected to one end, the heat receiving portion 41 is formed at one end.

As illustrated in FIGS. 3 and 4, a heat-receiving-portion surface area increasing portion 45 is provided in the heat receiving portion 41 in an inner surface of the container 19. Therefore, the heat-receiving-portion surface area increasing portion 45 is provided in the cavity portion 13 of the container 19. In the heat sink 1, the heat-receiving-portion surface area increasing portion 45 includes a plurality of uneven portions to increase an inner surface area of the heat receiving portion 41. In the heat sink 1, the heat-receiving-portion surface area increasing portion 45 is formed of a plurality of fin members. The heat-receiving-portion surface area increasing portion 45 has a configuration in which the plurality of fin members are arranged in parallel at predetermined intervals. A shape of the fin member is not particularly limited, such as a flat plate shape or a columnar shape (pin shape), but the heat-receiving-portion surface area increasing portion 45 uses a flat plate-shaped fin member. The heat-receiving-portion surface area increasing portion 45 is a member formed of a material having excellent thermal conductivity such as metal (for example, copper or copper alloy), and contributes to increase a heat receiving area from the heat-generating element 100 and an evaporation area when a liquid-phase working fluid changes in phase into a gas phase.

In addition, a wick portion (not illustrated) having a capillary force may be provided on the surface of the heat-receiving-portion surface area increasing portion 45 as needed. As the wick portion is provided on the surface of the heat-receiving-portion surface area increasing portion 45, the evaporation area when the liquid-phase working fluid changes in phase into a gas phase can be further increased, and the liquid-phase working fluid, which circulates through the first wick structure 14 from the heat radiating portion 42 toward the heat receiving portion 41, can smoothly reach the heat receiving portion 41 provided with the heat-receiving-portion surface area increasing portion 45. An example of the wick portion may be a sintered body of metal powder (for example, copper powder or copper alloy powder).

As illustrated in FIG. 1, the heat transport member 10 extends in a predetermined direction from the position of the heat-generating element 100, and the heat radiation fins 22 forming the heat radiation fin group 20 are thermally connected to the other end of the heat transport member facing the one end that is the heat receiving portion 41. The other end of the heat transport member 10 to which the heat radiation fin group 20 is thermally connected functions as the heat radiating portion 42 of the heat transport member 10. A space between the heat receiving portion 41 and the heat radiating portion 42 is a heat insulating portion 43 of the heat transport member 10, and is formed at a central portion in a longitudinal direction of the container 19.

A dimension in a width direction of the heat transport member 10 in the heat receiving portion 41 can be appropriately selected according to a dimension in the width direction of the heat-generating element 100. In the heat transport member 10, the dimension in the width direction of the heat transport member 10 in the heat receiving portion 41 is substantially the same as the dimension in the width direction of the heat transport member 10 at the part (heat radiating portion 42) thermally connected to the heat radiation fin group 20 and the dimension in the width direction of the heat transport member 10 in the heat insulating portion 43. Thus, since the dimension in the width direction of the heat transport member 10 in the heat receiving portion 41 is prevented from being increased, the heat sink 1 can be installed even on the heat-generating element 100 mounted at high density. Moreover, the heat receiving portion 41, the heat insulating portion 43, and the heat radiating portion 42 of the heat transport member 10 extend along the same plane. Therefore, it is possible to prevent an increase in dimension in the height direction of the heat sink 1, in particular, dimension in the height direction of the heat receiving portion 41 and the heat insulating portion 43.

Further, according to the installation space of the heat sink 1, the dimension in the width direction of the heat transport member 10 in the heat receiving portion 41 may be configured to be larger than the dimension in the width direction of the heat transport member 10 in the heat radiating portion 42 and the dimension in the width direction of the heat transport member 10 in the heat insulating portion 43, or may be configured to be smaller than the dimension in the width direction of the heat transport member 10 in the heat radiating portion 42 and the dimension in the width direction of the heat transport member 10 in the heat insulating portion 43.

As illustrated in FIGS. 3 and 4, the first wick structure 14 extends in a heat transport direction X from the vicinity of one end of the container 19 to the other end of the container 19. The first wick structure 14 includes a branch portion 50 between the vicinity of one end of the container 19 and the other end of the container 19. The first wick structure 14 branches in a thickness direction Y of the heat transport member 10 at the branch portion 50. Further, the first wick structure 14 is a multi-stage stem part 51 having a plurality of stem parts 51 extending from the branch portion 50 in a predetermined direction (toward the heat radiating portion 42 in FIGS. 3 and 4). As the first wick structure 14 branches in the thickness direction Y of the heat transport member 10, the plurality of stem parts 51 extend at predetermined intervals in the thickness direction Y. The first wick structure 14 includes a trunk part 52 formed integrally from the vicinity of one end of the container 19 to the branch portion 50 and the stem part 51 formed from the branch portion 50 to the other end of the container 19.

In the heat sink 1, the first wick structure 14 has a multi-stage structure (two-stage structure in the heat sink 1) branched into two at the branch portion 50. Therefore, two stem parts 51, stem parts 51-1 and 51-2 extend toward the heat radiating portion 42 in the heat transport direction X of the heat transport member 10 at predetermined intervals in the thickness direction Y. In addition, the branch portion 50 is provided at a position corresponding to the heat insulating portion 43. As described above, the stem part 51 of the first wick structure 14 extends from the heat insulating portion 43 to the heat radiating portion 42, and the trunk part 52 of the first wick structure 14 extends from the heat insulating portion 43 to the vicinity of the heat receiving portion 41. Further, a tip end 53 of the trunk part 52 extending from the heat insulating portion 43 to the vicinity of the heat receiving portion 41 contacts with the heat-receiving-portion surface area increasing portion 45.

Examples of materials of the first wick structure 14 are not particularly limited, but may include a sintered body of metal powders, such as copper powder, a metal mesh formed of metal wires, a nonwoven fabric, and a metal fiber, for example. In the heat transport member 10, a sintered body of metal powder is used as the first wick structure 14. A part of the cavity portion 13 where the first wick structure 14 is not provided functions as a steam flow path 15 through which a gas-phase working fluid flows. The steam flow path 15 extends from one end of the container 19 to the other end corresponding to the first wick structure 14 that extends from the vicinity of one end of the container 19 to the other end. The heat transport member 10 transports the heat of the heat-generating element 100 received by the heat receiving portion 41 from the heat receiving portion 41 to the heat radiating portion 42 according to heat transport characteristics due to the operation of the working fluid.

As illustrated in FIGS. 1 to 4, furthermore, a plurality of tube bodies 31 are provided at the other end of the heat transport member 10 such that the internal space thereof communicates with the cavity portion 13 of the container 19. Therefore, the working fluid flowing through the cavity portion 13 is sealed in a space from the cavity portion 13 to the inside of the tube body 31. Although the shape of the tube body 31 is not particularly limited, but is a linear shape in a longitudinal direction in the heat sink 1. In addition, all the tube bodies 31 have the same shape and dimension.

The plurality of tube bodies 31 are arranged at predetermined intervals in the thickness direction Y of the heat transport member 10. In the heat sink 1, two tube bodies 31, tube bodies 31-1 and 31-2 are arranged at a predetermined interval in the thickness direction Y of the heat transport member 10. The tube body 31 of the heat sink 1 has a multi-stage structure (two-stage structure in the heat sink 1) in which the tube body 31-1 forms a first-stage tube body 31 and the tube body 31-2 forms a second-stage tube body 31 in the thickness direction Y of the heat transport member 10. In the thickness direction Y of the heat transport member 10, further, the tube body 31-1 is located at a height corresponding to the stem part 51-1, and the tube body 31-2 is located at a height corresponding to the stem part 51-2.

Both the tube bodies 31-1 and 31-2 extend in a direction substantially orthogonal to the heat transport direction X of the heat transport member 10 along a plane direction of the heat transport member 10. In this manner, in the heat sink 1, since the extending direction of the tube body 31 is not parallel to the heat transport direction X of the heat transport member 10, the heat transported from the heat transport member 10 is transported in a direction different from the extending direction of the heat transport member 10 by the tube body 31. Therefore, since an increase in dimension of the heat sink 1 in the heat transport direction X of the heat transport member 10 can be prevented, space saving of the heat transport member 10 can be achieved in the heat transport direction X.

In addition, a plurality of tube bodies 31-1 and a plurality of tube bodies 31-2 are provided, respectively, and extend from the heat transport member 10 in a plurality of directions. In the heat sink 1, both the tube bodies 31-1 and 31-2 extend in both the left and right directions, that is, in two directions, with the heat transport member 10 as the center. Further, the tube bodies 31-1 and the tube bodies 31-2 are provided to have the same number in both the left and right directions with the heat transport member 10 as the center. Since the plurality of tube bodies 31 extend from the heat transport member 10 in the plurality of directions (two directions in the heat sink 1) in the heat sink 1, the heat transported from the heat transport member 10 is branched and transported in the plurality of directions (two directions in the heat sink 1) different from the extending direction of the heat transport member 10. Therefore, space saving of the heat sink 1 can be achieved in the heat transport direction X of the heat transport member 10.

Further, as illustrated in FIGS. 3 and 4, in the tube bodies 31-1 and 31-2, end portions (hereinafter, also referred to as "base portions") on the side of the cavity portion 13 are opened, and end portions (hereinafter, also referred to as "tip end portions") opposite to the cavity portion 13 are closed. The internal space of the tube body 31-1 and the internal space of the tube body 31-2 communicate with the cavity portion 13 of the container 19, and the internal space of the tube body 31-1 and the internal space of the tube body 31-2 are decompressed by deaeration processing in the same manner as in the cavity portion 13. Accordingly, the working fluid can flow between the cavity portion 13 of the container 19 and the internal space of the tube body 31.

A through hole (not illustrated) used for attaching the tube body 31 to the container 19 is formed in the side surface portion of the container 19. The shape and dimension of the through hole correspond to the shape and dimension of the tube body 31, the base portion of the tube body 31 is fitted to the through hole of the container 19, and accordingly, the tube body 31 is connected to the container 19. Therefore, the tube body 31 and the container 19 are made of different members. A method for fixing the tube body 31 attached to the container 19 may include welding, soldering, and brazing, for example.

Since the tube body 31 and the container 19 of the heat transport member 10 are made of different members, the arrangement, shape, dimensions and the like of the tube body 31 can be freely selected, and the degree of freedom in designing the heat sink 1 is improved. Further, since the tube body 31 can be attached to the container 19 by fitting and inserting the tube body 31 into the through hole of the container 19, the heat sink 1 can be easily assembled.

As illustrated in FIG. 4, second wick structures 34, which generate a capillary force, different from the first wick structure 14 accommodated in the container 19 are provided on inner surfaces of the tube bodies 31-1 and 31-2. The second wick structure 34 is not particularly limited, but may include, for example, a sintered body of metal powders, such as copper powder, a metal mesh formed of metal wires, a groove, a nonwoven fabric, a metal fiber, and the like. In the tube bodies 31-1 and 31-2, a plurality of fine grooves formed so as to cover the entire inner surface of the tube bodies 31-1 and 31-2 are used as the second wick structures 34. The fine grooves extend along the longitudinal direction of the tube bodies 31-1 and 31-2.

Further, as illustrated in FIGS. 2 and 4, the first wick structure 14 provided in the heat transport member 10 is connected to the second wick structure 34 provided in the tube body 31 via a connection member 35. The stem part 51-1 of the first wick structure 14 is connected to the second wick structure 34 provided in the tube body 31-1 via a connection member 35-1, and the stem part 51-2 of the first wick structure 14 is connected to the second wick structure 34 provided in the tube body 31-2 via a connection member 35-2. Therefore, the working fluid that has changed in phase from the gas phase to the liquid phase inside the tube body 31-1 circulates inside the second wick structure 34 from the tip end portion of the tube body 31-1 toward the base portion by the capillary force of the second wick structure 34 of the tube body 31-1, and the liquid-phase working fluid that circulates up to the base portion of the tube body 31 flows from the second wick structure 34 to one end of the connection member 35-1. The liquid-phase working fluid that has flowed from the second wick structure 34 to one end of the connection member 35-1 can flows from one end to another end of the connection member 35-1, and can circulate from the other end of the connection member 35-1 to the stem part 51-1 of the first wick structure 14. Further, the working fluid which has changed in phase from the gas phase into the liquid phase inside the tube body 31-2 circulates inside the second wick structure 34 from the tip end portion of the tube body 31-2 toward the base portion by the capillary force of the second wick structure 34 of the tube body 31-2, and the liquid-phase working fluid which has circulated up to the base portion of the tube body 31-2 flows from the second wick structure 34 to the one end of the connection member 35-2. The liquid-phase working fluid which has flowed from the second wick structure 34 to the one end of the connection member 35-2 can flow from the one end to the other end of the connection member 35-2 and circulate from the other end of the connection member 35-2 to the stem part 51-2 of the first wick structure 14.

From the above, the working fluid, which has changed in phase into the liquid phase inside the tube body 31, can smoothly circulate from the tube body 31 to the heat transport member 10 by the connection member 35. An example of the connection member 35 include a wick member having a capillary force, and specifically include a metal mesh, a braided metal wire, a metal fiber and the like. From the above, since the flow characteristics of the liquid-phase working fluid between the tube body 31 and the heat transport member 10 are improved, the heat sink 1 is improved in cooling performance.

In addition, the connection member 35 may be supported by a support member (not illustrated). In particular, since the connection member 35-1 is in a state of being bridged in the cavity portion 13, the flow of the liquid-phase working fluid circulating through the connection member 35-1 may be inhibited by the flow of the gas-phase working fluid. On the other hand, when the connection member 35-1 is supported by the support member from the lower side in the gravity direction, it is possible to prevent the inhibition of the flow of the liquid-phase working fluid, which circulates through the connection member 35-1, by the flow of the gas-phase working fluid. An example of the support member may include a plate-shaped member.

Examples of the material of the container 19 and the tube body 31 (tube bodies 31-1 and 31-2) include copper, copper alloy, aluminum, aluminum alloy, nickel, nickel alloy, stainless steel, and titanium. The working fluid sealed in the cavity portion 13 of the container 19 and the internal space of the tube body 31 can be appropriately selected according to the compatibility with the material of the container 19 and the tube body 31, and may include, for example, water, fluorocarbons, hydrofluoroether (HFE), cyclopentane, ethylene glycol, and a mixture thereof. A sintered body layer (not illustrated) of metal powder (for example, copper powder or copper alloy powder) may be provide in an inner bottom surface of the container 19, as needed, in order to further facilitate the circulating of the liquid-phase working fluid.

As illustrated in FIGS. 1 to 4, the heat radiation fin group 20 is formed by arranging the plurality of heat radiation fins 21, 21, 21, . . . and the plurality of heat radiation fins 22, 22, 22, . . . in parallel. Each of the heat radiation fins 21 and 22 is a thin flat plate-shaped member. Among the heat radiation fins, the heat radiation fins 21, 21, 21, . . . are arranged in parallel at predetermined intervals in a direction substantially parallel to the longitudinal direction of the tube body 31. In addition, the plurality of heat radiation fins 21, 21, 21, . . . are attached to the tube bodies 31-1 and 31-2. That is, the tube bodies 31-1 and 31-2 are attached to the common heat radiation fin 21. Therefore, both the tube bodies 31-1 and 31-2 extend along the arrangement direction of the heat radiation fins 21.

Further, the heat radiation fin group 20 includes the heat radiation fins 21 attached and fixed at the positions of the tube bodies 31-1 and 31-2 and thermally connected to the tube bodies 31-1 and 31-2 and the heat radiation fins 22 attached and fixed at the position of the heat transport member 10 and thermally connected to the heat transport member 10. Out of the heat radiation fin group 20, the heat radiation fins 22 located at the center portion in the arrangement direction of the heat radiation fin group 20 are attached and fixed at the position of the heat transport member 10 and are thermally connected to the heat transport member 10. The heat radiation fins 22 located at the center portion in the arrangement direction of the heat radiation fin group 20 are attached so as to be erected on the heat transport member 10. Meanwhile, out of the heat radiation fin group 20, the heat radiation fins 21 located at both side portions are attached and fixed at the positions of the tube bodies 31-1 and 31-2 and are thermally connected to the tube bodies 31-1 and 31-2. All of the heat radiation fins 21 thermally connected to the tube bodies 31-1 and 31-2 have the same shape and dimension.

The main surfaces of the heat radiation fins 21 and 22 are surfaces that mainly exhibit a heat radiation function of the heat radiation fins 21 and 22. The main surfaces of each of the heat radiation fins 21 and 22 are arranged so as to be in the extending direction of the tube bodies 31-1 and 31-2, that is, in a direction substantially orthogonal to the longitudinal direction. A cooling air F is supplied from a direction substantially parallel to the heat transport direction of the heat transport member 10. A thermal connection method of the heat radiation fins 21 to the tube bodies 31-1 and 31-2 is not particularly limited, and any known method can be used; for example, a method of forming a through hole corresponding to the position of the tube body 31-1 and a through hole corresponding to the position of the tube body 31-2 in the heat radiation fin 21, inserting the tube body 31-1 into the through hole corresponding to the position of the tube body 31-1, and inserting the tube body 31-2 into the through hole corresponding to the position of the tube body 31-2, or a method of bonding the heat radiation fin 21 to the tube body 31 by soldering can be employed. In addition, the thermal connection method of the heat radiation fins 22 to the heat transport member 10 is not particularly limited, and any known method can be used; for example, a method may be employed in which a fixing piece portion extending in a direction perpendicular to the main surface of the heat radiation fin 22 is provided at the end portion of the heat radiation fin 22, the piece portion is connected to the plane of the heat transport member 10, and the heat radiation fin 22 erects on the heat transport member 10.

The heat sink 1 is forcibly air-cooled by a blower fan (not illustrated), for example. The cooling air F derived from the blower fan is supplied along the main surfaces of the heat radiation fins 21 and 22 to cool the heat radiation fin group 20.

The material of the heat radiation fins 21 and 22 is not particularly limited, and may include, for example, metal materials such as copper, copper alloys, aluminum, and aluminum alloys, carbon materials such as graphite, and composite members using carbon materials.

Thereafter, a mechanism having a cooling function of the heat sink 1 will be described. First, the heat-generating element 100 which is an object to be cooled is thermally connected to one end (heat receiving portion 41) of the container 19 of the heat transport member 10. When one end of the container 19 receives heat from the heat-generating element 100, the heat is transferred to the liquid-phase working fluid in the cavity portion 13 at one end of the container 19, and the liquid-phase working fluid is changed in phase to the gas-phase working fluid at the cavity portion 13 at one end of the container 19. The gas-phase working fluid flows through the steam flow path 15 from one end of the container 19 to the other end (heat radiating portion 42). As the gas-phase working fluid flows from one end of the container 19 to the other end, the heat transport member 10 transports the heat from the one end to the other end. A part of the gas-phase working fluid that flows to the other end of the container 19 releases latent heat to change in phase into the liquid phase, and the released latent heat is transferred to the heat radiation fin 22 attached at the position of the heat transport member 10 and thermally connected to the heat transport member 10. The heat transferred to the heat radiation fins 22 from the heat transport member 10 is released to the external environment of the heat sink 1 via the heat radiation fins 22. The working fluid, which has changed in phase to the liquid phase at the other end of the container 19, flows through the stem part 51 and the trunk part 52 of the first wick structure 14 and circulates to the one end from the other end of the container 19 by the capillary force of the first wick structure 14 provided in the heat transport member 10.

Further, since the cavity portion 13 of the container 19 and the internal spaces of the tube bodies 31-1 and 31-2 connected to the side wall portion of the container 19 communicate with each other, among the gas-phase working fluids that have changed in phase from the liquid-phase working fluid, the working fluid that has not changed in phase to the liquid phase at the other end of the container 19 flows into the internal spaces of the tube bodies 31-1 and 31-2 from the cavity portion 13. The gas-phase working fluid that has flowed into the internal spaces of the tube bodies 31-1 and 31-2 releases the latent heat inside the tube bodies 31-1 and 31-2 and changes in phase into the liquid-phase working fluid. The latent heat released inside the tube bodies 31-1 and 31-2 is transferred to the heat radiation fin 21 attached to the tube bodies 31-1 and 31-2 and thermally connected to the tube bodies 31-1 and 31-2. The heat transferred to the heat radiation fins 21 thermally connected to the tube bodies 31-1 and 31-2 is released to the external environment of the heat sink 1 via the heat radiation fins 21. The working fluid that has changed in phase from the gas phase to the liquid phase inside the tube body 31-1 circulates from the center portion and the tip end portion of the tube body 31-1 to the base portion of the tube body 31-1 by the capillary force of the second wick structure 34 on the inner surface of the tube body 31-1. The liquid-phase working fluid that has circulated to the base portion of the tube body 31-1 circulates to the stem part 51-1 of the first wick structure 14 provided in the heat transport member 10 via the connection member 35-1. The liquid-phase working fluid that has circulated to the stem part 51-1 of the first wick structure 14 circulates to one end of the container 19 via the trunk part 52 of the first wick structure 14 by the capillary force of the first wick structure 14. The working fluid that has changed in phase from the gas phase to the liquid phase inside the tube body 31-2 circulates from the center portion and the tip end portion of the tube body 31-2 to the base portion of the tube body 31-2 by the capillary force of the second wick structure 34 on the inner surface of the tube body 31-2. The liquid-phase working fluid that has circulated to the base portion of the tube body 31-2 circulates to the stem part 51-2 of the first wick structure 14 provided in the heat transport member 10 via the connection member 35-2. The liquid-phase working fluid that has circulated to the stem part 51-2 of the first wick structure 14 circulates to one end of the container 19 via the trunk part 52 of the first wick structure 14 by the capillary force of the first wick structure 14.

In the heat sink 1 according to the embodiment of the present disclosure, the internal space of the heat transport member 10 is different from the internal space of the heat pipe group in which the plurality of heat pipes are arranged in parallel, and the entire internal space is integrated in a communicating manner. Further, in the heat sink 1, the heat transport member 10 transports the heat of the heat-generating element 100 from the heat receiving portion 41 to the heat radiation fin group 20. As described above, in the heat sink 1, the circulating characteristics of the liquid-phase working fluid is excellent, and even when the heat generation amount from the heat-generating element 100 increases, that is, even when the heat receiving amount in the heat receiving portion 41 increases, it is possible to equalize the heat input in the heat receiving portion 41 and increase the volume of the heat receiving portion, and to reduce heat resistance in the heat receiving portion 41. Therefore, even when the heat sink 1 is installed in a posture in which the heat receiving portion 41 of the heat transport member 10 is located above the heat radiating portion 42 in the gravity direction, excellent cooling performance can be exhibited on the heat-generating element 100. In addition, since the entire internal space of the heat transport member 10 is integrated in a communicating manner, the entire heat-generating element 100 can be uniformly cooled even when heating unevenness occurs in the heat-generating element 100. In the heat sink 1, since the first wick structure 14 has a multi-stage structure, the gas-phase working fluid can smoothly flow from the heat transport member 10 to the tube body 31. In the heat sink 1, the plurality of tube bodies 31 are arranged in the thickness direction Y of the heat transport member 10, that is, has a multi-stage structure including the tube bodies 31-1 and 31-2, and the first wick structure 14 accommodated in the heat transport member 10 includes the branch portion 50 branched in the thickness direction Y of the heat transport member 10 and the stem parts 51-1 and 51-2 extending from the branch portion 50. In addition, each of the heat radiation fins 21, 21, 21, . . . is thermally connected to both of the tube body 31-1 and the tube body 31-2. Therefore, since the entire main surface of each of the heat radiation fins 21, 21, 21, . . . can efficiently contributes to heat radiation, the cooling efficiency of the heat radiation fin 21 can be improved to exhibit excellent cooling performance with respect to the heat-generating element 100.

In the heat sink 1, further, since the entire internal space of the heat transport member 10 is integrated in a communicating manner, the dimension of the heat transport member 10 in the width direction can be reduced without deterioration of cooling performance, and, as a result, the heat sink 1 can be installed even in a narrow space and can also be installed on the heat-generating element 100 mounted with a high density.

In the heat sink 1, since the branched stem parts 51-1 and 51-2 of the first wick structure 14 is connected to the second wick structure 34 provided on the tube body 31-1 through the connection member 35-1 and the second wick structure 34 provided on the tube body 31-2 through the connection member 35-2, respectively, even when the plurality of tube bodies 31 are arranged in the thickness direction Y of the heat transport member 10, the working fluid, which has changed in phase into the liquid phase inside the tube body 31, can smoothly circulate from the tube body 31 to the heat transport member 10. Therefore, since the flow characteristics of the working fluid are improved, the heat sink 1 is improved in cooling performance.

In heat sink 1, since the tube body 31 that communicates with the internal space of the heat transport member 10 extends along the arrangement direction of the heat radiation fins 21, the gas-phase working fluid flows inside the tube body 31 along the arrangement direction of the heat radiation fins 21. Therefore, the cooling efficiency of the heat radiation fin group 20 is improved, and thus the heat sink 1 can exhibit more excellent cooling performance.

Next, a heat sink according to another embodiment of the present disclosure will be described below. In the heat sink according to the above-described embodiment, the first wick structure is branched into two stem parts in the thickness direction of the heat transport member and the tube body has a two-state structure, but the number of stem parts branched in the thickness direction of the heat transport member and the number of stages of the tube body can be appropriately selected according to usage conditions or installation environments of the heat sink, for example, the first wick structure may be branched into three or more stem parts in the thickness direction of the heat transport member and the tube body may have a multi-stage structure of three or more stages.

In the heat sink according to above-described embodiment, further, the tube body has the two-stage structure in which two tube bodies are provided in the thickness direction of the heat transport member, but may alternatively have one-stage structure in which one tube body is provided in the thickness direction of the heat transport member. When one tube body is provided in in the thickness direction of the heat transport member, the connection member connected to the second wick structure of the tube body can be provided to be connected to each of the stem parts that are branched in the thickness direction of the heat transport member.

In the heat sink according to above-described embodiment, the shape of the tube body in the longitudinal direction is the linear shape, but may alternatively be a shape having a bent portion such as an L-shape. In the heat sink according to above-described embodiment, further, the shape of the container is a planar type, but the container may alternatively be provided with a stepped portion in the thickness direction of the heat transport member depending on installation environment of the heat sink or the like.

The heat sink of the present disclosure can improve cooling efficiency of the heat radiation fin and exhibit excellent cooling performance with respect to the cooling target regardless of the installation posture of the heat sink, and can be installed even in a narrow space. From the above, for example, the heat sink has a high utility value in the field of cooling of electronic components with high heat generation, for example, an electronic component such as a central processing unit which is mounted on electronic devices installed in a data center.

What is claimed is:

1. A heat sink comprising:
   a heat transport member having a heat receiving portion thermally connected to a heat-generating element and including a first wick structure;
   a tube body connected to a heat insulating portion or a heat radiating portion of the heat transport member and including a second wick structure; and
   a heat radiation fin group which is thermally connected to the tube body and in which a plurality of heat radiation fins are arranged, wherein
   the heat transport member has an integral internal space that communicates from the heat receiving portion to a connection portion with the tube body and is sealed with a working fluid, the internal space of the heat transport member communicating with an internal space of the tube body, and
   the first wick structure includes a branch portion branched in a direction orthogonal to a heat transport direction of the heat transport member and multi-stage stem parts extending from the branch portion in a predetermined direction.

2. The heat sink according to claim 1, wherein a plurality of tube bodies are arranged in the direction orthogonal to the heat transport direction of the heat transport member.

3. The heat sink according to claim 1, wherein the stem part has a part extending in a heat transport direction of the heat transport member.

4. The heat sink according to claim 1, wherein the stem part is connected to the second wick structure via a connection member.

5. The heat sink according to claim 4, wherein the connection member is a wick member having a capillary force.

6. The heat sink according to claim 4, wherein the connection member is supported by a support member.

7. The heat sink according to claim 1, wherein a heat-receiving-portion surface area increasing portion is provided on an inner surface of the heat receiving portion.

8. The heat sink according to claim 1, wherein the tube body extends along an arrangement direction of the heat radiation fins.

9. The heat sink according to claim 1, wherein an extending direction of the tube body is not parallel to a heat transport direction of the heat transport member.

10. The heat sink according to claim 1, wherein the tube body extends in a plurality of direction from the heat transport member.

11. The heat sink according to claim 1, wherein at least one surface of the heat transport member has a planar shape.

* * * * *